United States Patent [19]
Yoon

[11] Patent Number: 5,895,735
[45] Date of Patent: Apr. 20, 1999

[54] PHASE SHIFT MASKS INCLUDING FIRST AND SECOND RADIATION BLOCKING LAYER PATTERNS, AND METHODS OF FABRICATING AND USING THE SAME

[75] Inventor: Hee-sun Yoon, Kyungki-do, Rep. of Korea

[73] Assignee: Samsung Electronics Co., Ltd., Suwon, Rep. of Korea

[21] Appl. No.: 08/899,607

[22] Filed: Jul. 24, 1997

[30] Foreign Application Priority Data

Oct. 10, 1996 [KR] Rep. of Korea ............... 1996-45130

[51] Int. Cl.$^6$ ............................................. G03F 9/00
[52] U.S. Cl. ..................................................... 430/5
[58] Field of Search ........................... 430/5, 322, 323, 430/324

[56] References Cited

U.S. PATENT DOCUMENTS

| | | | |
|---|---|---|---|
| 5,045,417 | 9/1991 | Okamoto | 430/5 |
| 5,424,153 | 6/1995 | Asai | 430/5 |
| 5,478,678 | 12/1995 | Yang et al. | 430/5 |
| 5,582,939 | 12/1996 | Pierrat | 430/5 |
| 5,591,549 | 1/1997 | Yang | 430/5 |

*Primary Examiner*—S. Rosasco
*Attorney, Agent, or Firm*—Myers Bigel Sibley & Sajovec

[57] ABSTRACT

Phase shift masks include axially spaced apart first and second radiation blocking layer patterns and a phase shifting layer pattern between the first and second radiation blocking layer patterns, on a phase shift mask substrate. The first and second axially spaced part radiation blocking layers can define narrow areas of the phase shifting layers so that patterns having fine linewidths and improved resolution can be formed on integrated circuits. Phase shifting masks can be fabricated by forming a first radiation blocking layer pattern on a phase shift mask, blanket forming a phase shifting layer and a second radiation blocking layer, patterning the second radiation blocking layer and patterning the phase shifting layer.

12 Claims, 3 Drawing Sheets

PHASE SHIFT MASKS INCLUDING FIRST AND SECOND RADIATION BLOCKING LAYER PATTERNS, AND METHODS OF FABRICATING AND USING THE SAME

FIELD OF THE INVENTION

This invention relates to integrated circuit fabrication, and more particularly to phase shift masks for integrated circuits and methods of fabricating and using phase shift masks.

BACKGROUND OF THE INVENTION

As integration densities of integrated circuit devices continue to increase, it may become increasingly difficult to fabricate fine linewidths using conventional photomasks. Photomasks are conventionally used to expose photoresists according to a predetermined pattern. The photoresist is used to pattern an underlying layer such as a semiconductor substrate, or a conductive or insulating layer. Conventional photomasks may be limited in defining fine linewidths for highly integrated devices. Accordingly, phase shift masks are being used as an alternative for increasing integration density.

In contrast with a conventional transparent photomask, the phase shift mask operates on the principle that radiation such as light having different phases can interfere. For example, if radiation such as light from a light source passes through adjacent slits, the light emerging from the slits has different phases that can mutually interfere. When the value of the phase difference satisfies a predetermined criteria, mutual destructive interference can occur between the light. A photomask using this interference principle is generally referred to as a "phase shift mask".

Phase shift masks can therefore offer increased resolution and improved depth of focus compared to conventional photomasks. Thus, very fine patterns can be formed compared to conventional photomasks. Phase shift masks are especially useful in forming repeated line-space patterns where phase shifts of 180° between adjacent apertures can produce cancellation of light.

A major type of phase shift mask currently being used is referred to as a "Levenson" mask. The Levenson phase shift mask is described in a publication entitled "*Optical/Laser Microlithography VIII*", SPIE Proceedings, Volume 2440, Feb. 22–24, 1995, pp. 34–36, and U.S. Pat. No. 5,358,829, issued Oct. 25, 1994 to Garafalo et al., entitled "*Phase-Shifting Lithographic Masks With Improved Resolution*", the disclosures of which are hereby incorporated herein by reference. There are generally two fabrication methods for Levenson phase shift masks. The first involves etching of a substrate and the second forms a phase shifting layer on a substrate.

In the first method, a photomask substrate such as a quartz substrate is etched in a predetermined pattern. Thus, phase differences are generated based on the principle that incident light which passes through the etched and unetched portions of the photomask substrate will have different path lengths and therefore will have different phases.

In phase shift masks which are fabricated by forming a phase shifting layer on a substrate, a spin-on-glass (SOG) layer is generally coated on a photomask substrate and then patterned, thereby exposing predetermined portions of the substrate. This type of phase shift mask is also referred to as an SOG-coated phase shift mask. Phase differences are created by radiation passing through the portion of the substrate which includes the patterned SOG coating relative to the exposed portions of the substrate.

Although phase shift masks which include phase shifting layer patterns can form finer linewidths than conventional masks, there continues to be a need for forming ever-finer linewidths due to the ever-increasing integration density of microelectronic devices.

Referring now to FIGS. 1A–1C, a method for fabricating a conventional SOG-coated phase shift mask will now be described so as to illustrate problems which are encountered with conventional phase shift masks. In particular, as shown in FIG. 1A, a radiation blocking layer pattern 15 is formed on a phase shift mask substrate 10. The radiation blocking layer pattern 15 defines a predetermined portion h of the phase shift mask substrate. The radiation blocking layer pattern may be formed by blanket depositing a radiation blocking layer such as chrome (Cr) on the substrate 10. A photoresist pattern is then formed to expose a predetermined portion of the radiation blocking layer by coating a photoresist on the radiation blocking layer and patterning the coated photoresist. The radiation blocking layer is then patterned by removing a predetermined portion thereof using the photoresist pattern as an etch mask. Then, the photoresist remaining on the radiation blocking layer 15 is removed.

Referring now to FIG. 1B, a phase shifting layer 20 is formed on the substrate 10 including on the radiation blocking film pattern 15 and on the substrate between the radiation blocking film pattern 15.

As shown in FIG. 1C, a phase shifting layer pattern 20a is formed from the phase shifting layer 20, to thereby define the substrate into phase shifting layer-coated areas and phase shift layer-free exposed areas. Phase shifting layer 20 may be patterned by coating a photoresist on the phase shifting layer 20, patterning the photoresist, patterning the phase shifting layer 20 using the patterned photoresist as a mask and then removing the remaining photoresist from phase shifting layer pattern 20a.

Although phase shift masks as described in connection with FIGS. 1A–1C can provide improved photomasks relative to conventional photomasks, it may be desirable to form even finer patterns for integrated circuits than can be formed with the above-described phase shift masks.

SUMMARY OF THE INVENTION

It is therefore an object of the present invention to provide improved phase shift masks and methods of fabricating and using the same.

It is another object of the present invention to provide improved phase shift masks which can produce even finer lines than can be produced with conventional phase shift masks, and methods of fabricating and using the same.

These and other objects are provided, according to the present invention, by phase shift masks which include axially spaced apart first and second radiation blocking layer patterns and a phase shifting layer pattern between the axially spaced apart first and second radiation blocking layer patterns, on a phase shift mask substrate. The first and second radiation blocking layer patterns are preferably at least partially laterally offset from one another, so that fine line patterns may be defined in integrated circuits.

In particular, phase shift masks according to the invention include a phase shift mask substrate and a first radiation blocking layer pattern on the phase shift mask substrate that defines a predetermined portion of the phase shift mask substrate. A phase shifting layer pattern is included on at least part of the predetermined portion of the phase shift mask substrate. A second radiation blocking layer pattern is included on at least part of the phase shifting pattern, opposite the substrate. At least a portion of the second radiation blocking layer pattern is laterally offset from the first radiation blocking layer pattern. In an alternate embodiment, the first radiation blocking layer pattern is omitted.

In preferred embodiments, the phase shifting layer pattern also extends onto the first radiation blocking layer pattern. The first radiation blocking layer pattern is preferably between about 400 Å and 1000 Å thick, and the first and second radiation blocking layer patterns have optical density of between about 2.0 and 3.5.

Phase shift masks are fabricated, according to the present invention, by forming a first radiation blocking layer pattern on a phase shift mask substrate to define a predetermined portion of the phase shift mask substrate. A phase shifting layer is blanket-formed on the first radiation blocking pattern and on the predetermined portion of the phase shift mask substrate. A second radiation blocking layer is blanket-formed on the phase shifting layer opposite the substrate. The second radiation blocking layer is patterned to define a second radiation blocking layer pattern, at least a portion of which is laterally offset from the first radiation blocking layer pattern. The phase shifting layer is then patterned to define a phase shifting layer pattern that defines at least part of the phase shift mask substrate between the first and second radiation blocking layers. Preferably, the phase shifting layer is patterned using the first and second radiation blocking layer patterns as a mask, to thereby provide a self-aligned phase shifting layer. Accordingly, fine linewidths may be produced using the exposed portions of the substrate and the phase shifting layer pattern between the first and second radiation blocking layers.

Integrated circuits are fabricated according to the invention by exposing an integrated circuit to patterned exposure radiation by passing exposure radiation through a phase shift mask comprising axially spaced apart first and second radiation blocking layer patterns and a phase shifting layer pattern therebetween, on a phase shift mask substrate. The first and second radiation blocking layers are at least partially laterally offset from one another, so that the radiation axially passes between the first and second radiation blocking layers. Fine linewidths may thereby be produced on integrated circuits.

DETAILED DESCRIPTION OF PREFERRED EMBODIMENTS

Figure 1A:
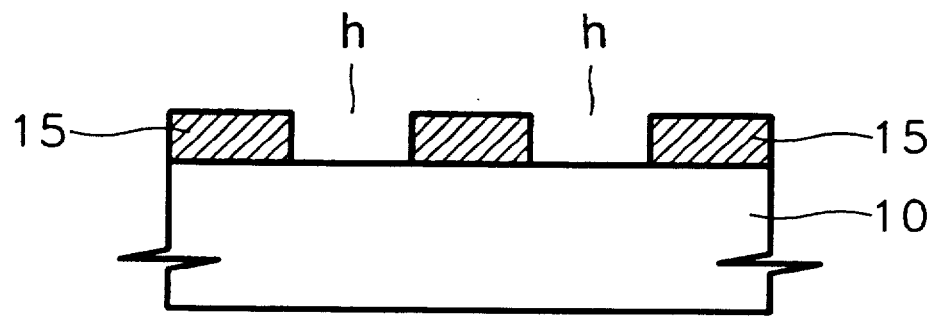
FIGS. 1A–1C are cross-sectional views that sequentially illustrate a conventional method for fabricating a phase shift mask.
Figure 1B:
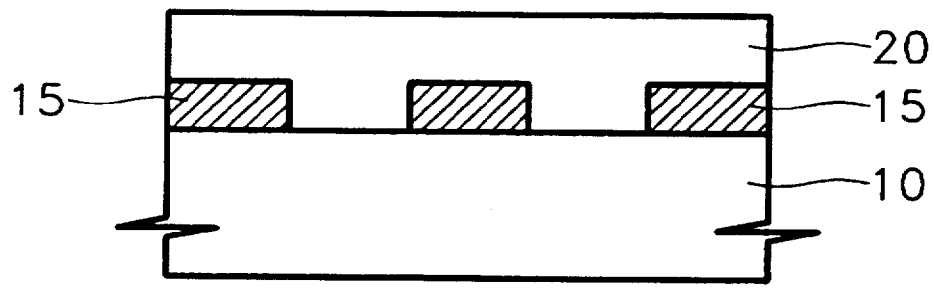
Figure 1C:
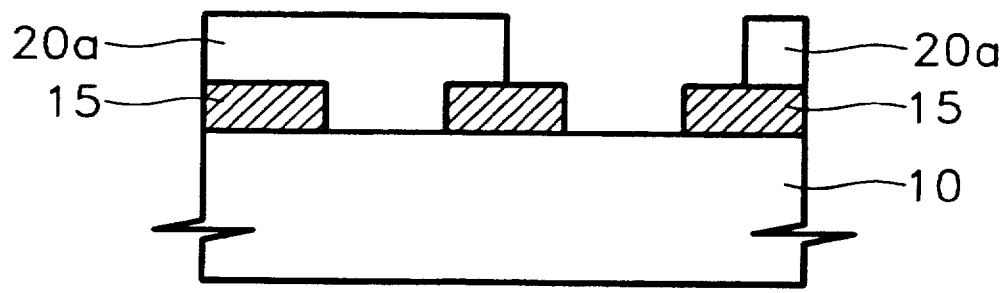

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will also be understood that when a layer is referred to as being "on" another layer or substrate, it can be directly on the other layer or substrate, or intervening layers may also be present.

Phase shift masks according to the invention, having double light blocking layers, will first be described with reference to FIG. 2G. Then, methods of fabricating phase shift masks according to the invention will be described in connection with FIGS. 2A–2G.

Figure 2A:
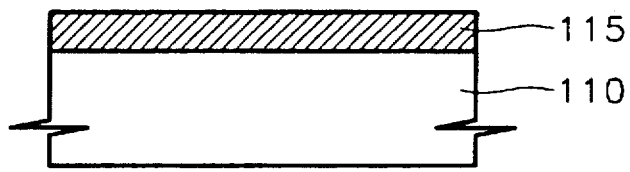
FIGS. 2A–2G are cross-sectional views that sequentially illustrate methods for manufacturing phase shift masks according to the present invention.
Figure 2B:
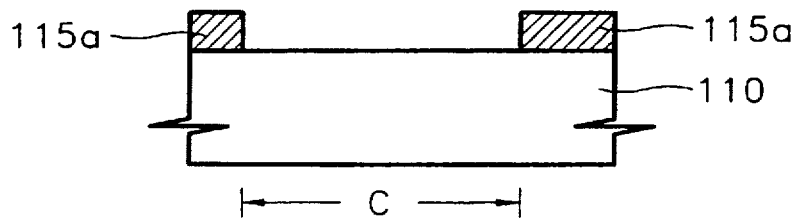
Figure 2C:
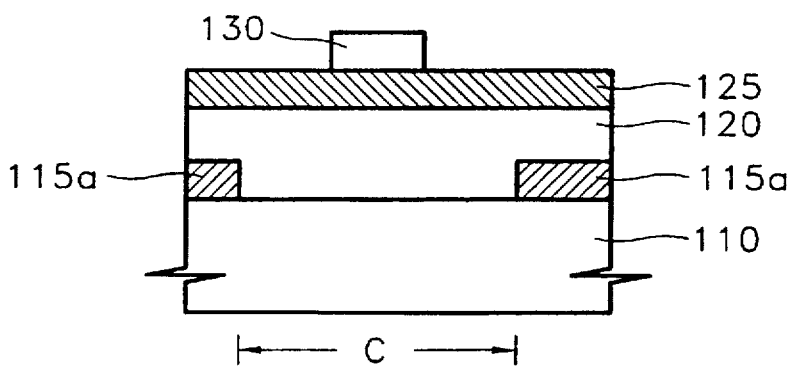
Figure 2D:
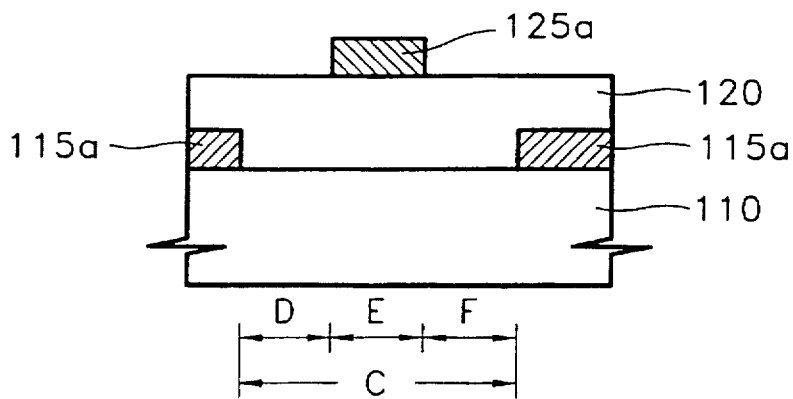
Figure 2E:
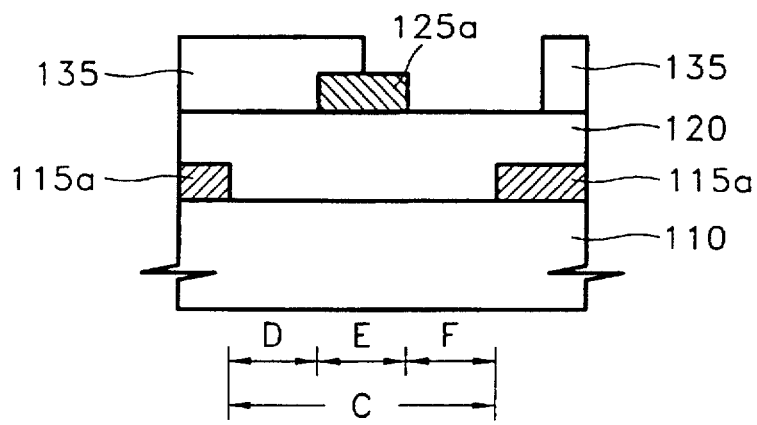
Figure 2F:
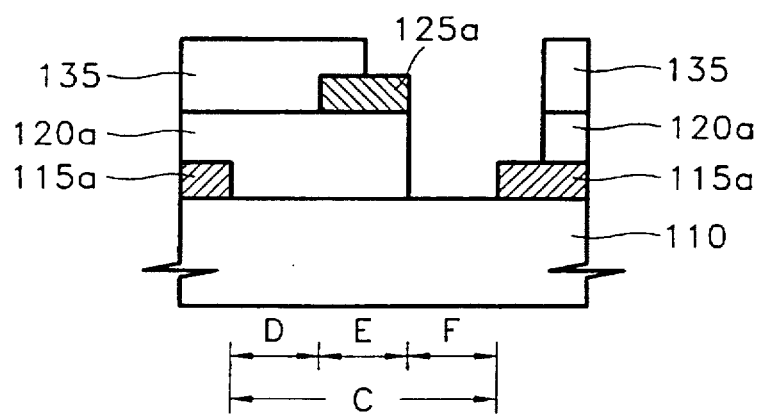
Figure 2G:
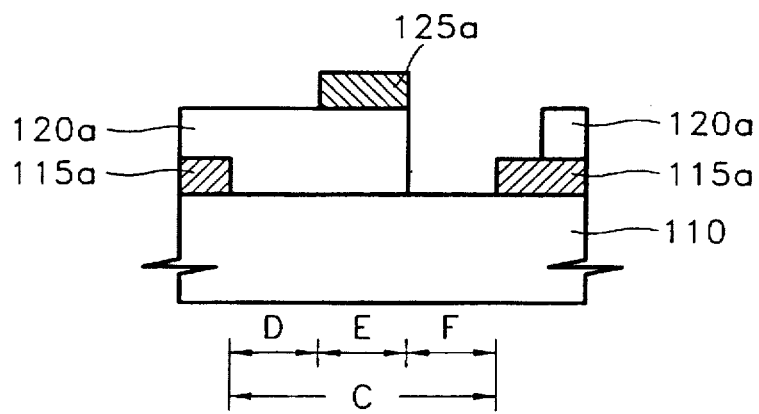

Referring to FIG. 2G, phase shift masks according to the invention include a phase shift mask substrate 110 and a first radiation blocking layer pattern 115a which defines and preferably exposes a portion C of the substrate 110. A phase shifting layer pattern 120a is included on at least a portion D and E of the substrate 110 exposed by the first radiation blocking layer pattern 115a, and on at least a portion of the first radiation blocking layer pattern 115a. A second radiation blocking layer pattern 125a is included on the phase shifting layer pattern 120a, laterally offset from the first radiation blocking layer pattern 115a by a predetermined distance D or F, to define and preferably expose a portion F of the substrate 110 115a.

It will be understood that in operation, incident radiation such as light passes through the phase shift mask of FIG. 2G in the vertical direction in FIG. 2G. This direction is referred to as the "axial" direction. Thus, for example, the incident exposure radiation may impinge on the phase shifting mask from above the mask as illustrated in FIG. 2G, may be patterned by the mask and may impinge on an integrated circuit which is maintained below the mask in FIG. 2G. As also shown in FIG. 2G, the first and second radiation blocking layer patterns are offset from each other in the lateral direction, which is the horizontal direction in FIG. 2G.

It is preferable for the first radiation blocking layer pattern 115a to be between about 400 Å–1000 Å thick. The first radiation blocking layer pattern 115a can be formed of material having an optical density of between about 2.0–3.5. The phase shifting layer pattern 120a is preferably formed of material which can shift the phase of incident radiation during an integrated circuit exposure process.

Thus, phase shift masks having double light blocking patterns according to the invention can realize fine linewidths having a higher pattern resolution than conventional phase shift masks. For example, a pattern resolution which is two times higher than that obtained with a conventional phase shift mask can be realized.

FIGS. 2A–2G are cross-sectional views sequentially illustrating phase shift mask fabricating methods according to the present invention. FIG. 2A illustrates the step of forming a first radiation blocking layer 115 by coating a radiation blocking material on the phase shift mask substrate 110. Chrome (Cr) may be used as the radiation blocking material. It is preferable to form the first radiation blocking layer to a thickness of 400 Å–1000 Å. The first radiation blocking layer can be formed of material having an optical density of between about 2.0–3.5.

FIG. 2B illustrates the step of forming the first radiation blocking layer pattern 115a by patterning the first radiation blocking layer 115. The first radiation blocking layer pattern 115a defines and preferably exposes a portion C of the phase shift mask substrate 110. The first radiation blocking layer may be patterned using conventional photolithography.

FIG. 2C illustrates the steps of sequentially coating a phase shifting layer 120 and a second radiation blocking layer 125 on the surface of the substrate 110 including on the first radiation blocking layer pattern 115a. The phase shifting layer 120 is preferably formed of a material which can create a phase difference of 180° during exposure. A photoresist pattern 130 is then formed on a portion of the second radiation blocking layer 125.

In particular, the phase shifting layer 120 and the second radiation blocking layer 125 are coated on the surface of the substrate 110 including on the first radiation blocking layer pattern 115a. Photoresist is coated on the second radiation blocking layer 125 and a photoresist pattern 130 is formed to expose a portion of the second radiation blocking layer 125, by patterning the photoresist.

The photoresist pattern 130 preferably is formed on a portion of the second radiation blocking layer 125 which is on the substrate area C which was exposed by the first radiation blocking layer pattern 115a.

FIG. 2D illustrates the step of forming the second radiation blocking layer pattern 125a on the phase shifting layer 120. The second radiation blocking layer pattern 125a is formed by removing the second radiation blocking layer 125 of FIG. 2C which is exposed by the photoresist pattern 130 of FIG. 2C. Then, the remaining photoresist pattern 130 of FIG. 2C on the second radiation blocking layer pattern 125a is removed. Thus, the second radiation blocking layer pattern 125a is formed on the area E of the phase shifting layer 120 on the substrate 110 which is exposed by the first radiation blocking layer pattern 115a.

As shown, the second radiation blocking layer pattern 125a is laterally offset from the first radiation blocking layer pattern 115a by the distance D and F. Therefore, the substrate portion C defined by the first radiation blocking layer pattern 115a is divided into three areas D, E and F by the second radiation blocking layer pattern 125a.

FIG. 2E illustrates the step of forming a photoresist pattern 135 for exposing a predetermined area of the phase shifting layer 120. A photoresist layer is formed on the phase shifting layer 120 including on the second radiation blocking layer pattern 125a. Then, a photoresist pattern 135 is formed to expose an area of the phase shifting layer 120 by patterning the photoresist.

FIG. 2F illustrates the step of forming the phase shifting layer pattern 120a to define and preferably expose the area F of the substrate 110 by removing the exposed portion of the phase shifting layer 120, using the photoresist pattern 135 of FIG. 2E and the first and second radiation blocking layer patterns 125a and 115a as a mask. The phase shifting layer pattern 120a is thus preferably formed using a self-aligned method. Alignment marks may be used.

FIG. 2G illustrates the step of completing the phase shift mask by removing the photoresist pattern 135. Thus, phase shift masks and fabricating methods can be provided, which can obtain fine linewidths having a higher pattern resolution, for example twice the pattern resolution of a conventional phase shift mask. Accordingly, integrated circuits may be formed having fine linewidths of higher resolution, for example twice the resolution as conventional integrated circuits.

Figure 3:
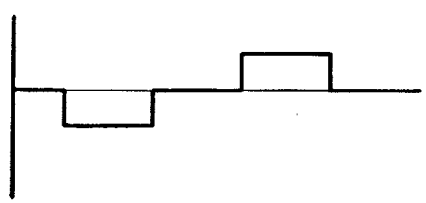
FIG. 3 is a graph illustrating phase variation during exposure of the phase shift mask of FIG. 2G.

The formation of fine linewidths on integrated circuits will be described referring to FIG. 3. FIG. 3 is a graph illustrating phase variation of incident radiation when the phase shift mask of FIG. 2G is used to expose integrated circuits. The vertical axis represents the phase of radiation axially transmitted through a photomask with respect to a laterally extending photomask pattern on the horizontal axis. The graph specifically shows that radiation incident on the phase shift mask is blocked in an area of the substrate including the light blocking films 115a or 125a of FIG. 2G. As also shown, mutual phase shifts occur between radiation simultaneously transmitted through the area D of FIG. 2G and area F of FIG. 2G corresponding to the substrate areas D and F exposed by the radiation blocking layer patterns.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A phase shift mask comprising:

a phase shift mask substrate;

a first radiation blocking layer pattern on the phase shift mask substrate that defines a predetermined portion of the phase shift mask substrate;

a phase shifting layer pattern on a first part of the predetermined portion of the phase shift mask substrate so that a second part of the predetermined portion is free of the phase shifting layer pattern; and a second radiation blocking layer pattern on at least part of the phase shifting layer pattern opposite the substrate, at least a portion of which is laterally offset from the first radiation blocking layer pattern.

2. A phase shift mask according to claim 1 wherein the phase shifting layer pattern also extends onto the first radiation blocking layer pattern.

3. A phase shift mask according to claim 1 wherein the first radiation blocking layer pattern is between about 400 Å and 1000 Å thick.

4. A phase shift mask according to claim 1 wherein the first and second radiation blocking layer patterns have optical density between about 2.0 and 3.5.

5. A phase shift mask comprising axially spaced apart first and second radiation blocking layer patterns and a phase shifting layer pattern therebetween, on a phase shift mask substrate, wherein a predetermined portion of the phase shift mask substrate is free of the phase shifting layer pattern thereon.

6. A phase shift mask according to claim 5 wherein the first and second radiation blocking layers are at least partially laterally offset from one another.

7. A method of fabricating a phase shift mask comprising the steps of:

forming a first radiation blocking layer pattern on a phase shift mask substrate to define a predetermined portion of the phase shift mask substrate;

blanket forming a phase shifting layer on the first radiation blocking pattern and on the predetermined portion of the phase shift mask substrate;

blanket forming a second radiation blocking layer on the phase shifting layer opposite the substrate;

patterning the second radiation blocking layer to define a second radiation blocking layer pattern, at least a portion of which is laterally offset from the first radiation blocking layer pattern; and patterning the phase shifting layer to define a phase shifting layer pattern such that at least part of the phase shift mask substrate between the first and second radiation blocking layers is free of the phase shifting layer.

8. A method according to claim 7 wherein the first radiation blocking layer pattern is between about 400 Å and 1000 Å thick.

9. A method according to claim 7 wherein the first and second radiation blocking layer patterns have optical density between about 2.0 and 3.5.

10. A method according to claim 7 wherein the step of patterning the phase shifting layer comprises the step of patterning the phase shifting layer using the first and second radiation blocking layer patterns as a mask to thereby provide a self aligned phase shifting layer.

11. A method of fabricating an integrated circuit comprising the step of:

exposing an integrated circuit substrate to patterned exposure radiation by passing exposure radiation through a phase shift mask comprising axially spaced apart first and second radiation blocking layer patterns and a phase shifting layer pattern therebetween, on a phase shift mask substrate, wherein a predetermined portion of the phase shift mask substrate is free of the phase shifting layer pattern thereon.

12. A method according to claim 11 wherein the first and second radiation blocking layers are at least partially laterally offset from one another so that the radiation axially passes between the first and second radiation blocking layers.

* * * * *